US010914783B2

(12) United States Patent
Kuroda et al.

(10) Patent No.: US 10,914,783 B2
(45) Date of Patent: Feb. 9, 2021

(54) TEST CIRCUIT AND SEMICONDUCTOR DEVICE

(71) Applicant: ABLIC Inc., Chiba (JP)

(72) Inventors: Tadakatsu Kuroda, Chiba (JP); Tsutomu Tomioka, Chiba (JP); Hideyuki Sawai, Chiba (JP)

(73) Assignee: ABLIC INC., Chiba (JP)

( * ) Notice: Subject to any disclaimer, the term of this patent is extended or adjusted under 35 U.S.C. 154(b) by 42 days.

(21) Appl. No.: 16/257,225

(22) Filed: Jan. 25, 2019

(65) Prior Publication Data

US 2019/0277908 A1    Sep. 12, 2019

(30) Foreign Application Priority Data

Mar. 9, 2018 (JP) ................................ 2018-043330

(51) Int. Cl.
*G01R 31/28* (2006.01)
*G01R 31/26* (2020.01)
*H01L 21/66* (2006.01)

(52) U.S. Cl.
CPC ..... *G01R 31/2879* (2013.01); *G01R 31/2621* (2013.01); *G01R 31/2856* (2013.01); *G01R 31/2882* (2013.01); *G01R 31/2884* (2013.01); *H01L 22/32* (2013.01)

(58) Field of Classification Search
CPC ............ G01R 31/2879; G01R 31/2884; G01R 31/2882; G01R 31/2856; G01R 31/2621; H01L 22/32
USPC .................................................... 324/762.09
See application file for complete search history.

(56) References Cited

U.S. PATENT DOCUMENTS

| | | | | |
|---|---|---|---|---|
| 4,472,820 A * | 9/1984 | Borras | ................. | H03C 3/0933 331/1 A |
| 5,428,576 A * | 6/1995 | Furuyama | .............. | G11C 5/145 365/201 |
| 5,596,297 A * | 1/1997 | McClure | ................. | G05F 3/262 327/530 |
| 5,646,550 A * | 7/1997 | Campbell, Jr. | .... | H03K 19/0013 326/121 |
| 5,661,729 A * | 8/1997 | Miyazaki | ............... | G11C 29/36 365/201 |
| 5,726,945 A * | 3/1998 | Ukita | ..................... | G11C 5/147 365/226 |
| 5,770,964 A * | 6/1998 | Suma | .................. | G01R 31/3185 327/328 |
| 5,777,930 A * | 7/1998 | Sugiura | ................... | G11C 29/46 365/189.11 |
| 5,936,886 A * | 8/1999 | Fujio | ....................... | G11C 16/30 365/185.11 |
| 6,023,186 A * | 2/2000 | Kuroda | .............. | G01R 31/3004 257/371 |

(Continued)

FOREIGN PATENT DOCUMENTS

JP    2000163998    6/2000

*Primary Examiner* — Christopher P McAndrew
(74) *Attorney, Agent, or Firm* — Brinks Gilson & Lione

(57) ABSTRACT

A test circuit includes a test pad supplied with a test signal causing the test circuit to be transitioned to a test mode, and further includes a first p channel MOS transistor having a source connected to the test pad, and a gate applied with a prescribed reference voltage, a first n channel MOS transistor having a drain connected to a drain of the first p channel MOS transistor, and a source grounded via a first current limiting element, and a control circuit which has an input terminal connected to the drain of the first n channel MOS transistor, and an output terminal connected to a gate of the first n Tr, and controls the first n channel MOS transistor from an on state to an off state when the test signal becomes a prescribed voltage or more.

11 Claims, 5 Drawing Sheets

(56) References Cited

U.S. PATENT DOCUMENTS

| | | | | |
|---|---|---|---|---|
| 6,031,777 | A * | 2/2000 | Chan | G01R 31/3004 365/189.07 |
| 6,040,968 | A * | 3/2000 | Duvvury | H01L 27/0248 361/56 |
| 6,066,973 | A * | 5/2000 | Sekino | H03K 19/00361 327/313 |
| 6,252,423 | B1 * | 6/2001 | Oshima | H03K 19/00315 326/62 |
| 6,380,770 | B1 * | 4/2002 | Pasqualini | H03K 17/164 326/27 |
| 6,754,094 | B2 * | 6/2004 | McClure | G11C 29/50 365/145 |
| 6,788,107 | B2 * | 9/2004 | Wang | H03K 19/00315 326/33 |
| 6,977,858 | B2 * | 12/2005 | Osada | G06F 11/1008 365/222 |
| 2005/0207237 | A1 * | 9/2005 | Isobe | G11C 29/02 365/189.11 |
| 2005/0237083 | A1 * | 10/2005 | Bakker | H03K 17/223 326/47 |
| 2007/0176233 | A1 * | 8/2007 | Ozawa | H03K 19/0107 257/335 |
| 2008/0048716 | A1 * | 2/2008 | Balasubramanian | H03K 19/17744 326/38 |
| 2008/0094101 | A1 * | 4/2008 | Balasubramanian | H03K 17/687 326/38 |
| 2008/0157124 | A1 * | 7/2008 | Taniguchi | H01L 23/50 257/203 |
| 2011/0102955 | A1 * | 5/2011 | Yasumori | H01L 27/0251 361/56 |
| 2012/0154960 | A1 * | 6/2012 | Tsai | H02H 9/046 361/56 |

\* cited by examiner

PRIOR ART

TEST CIRCUIT AND SEMICONDUCTOR DEVICE

RELATED APPLICATIONS

This application claims priority under 35 U.S.C. § 119 to Japanese Patent Application No. 2018-043330 filed on Mar. 9, 2018, the entire content of which is hereby incorporated by reference.

BACKGROUND OF THE INVENTION

1. Field of the Invention

The present invention relates to a test circuit which tests elements configuring a semiconductor integrated circuit, and a semiconductor device.

2. Description of the Related Art

With an increase in the scale and the function of a semiconductor integrated circuit a wide variety of techniques have recently been developed even for its evaluation and test method.

In an evaluation and test method, a test circuit is provided within a chip in which the semiconductor integrated circuit is formed. A test pad connected to the test circuit is brought into contact with a test pin of a measurement device such as a semiconductor tester or the like to measure circuit characteristics and element characteristics of the semiconductor integrated circuit on the chip (refer to, for example, Japanese Patent Application Laid-Open No. 2000-163998).

SUMMARY OF THE INVENTION

In a semiconductor integrated circuit, the measurement of element characteristics of a transistor, a resistor, etc., is carried out in a test mode for acquisition of process variation or analysis of failure. In the test mode there is a case where a voltage is applied from the test pad to measure current.

As illustrated in FIGS. 6 and 7, in a certain circuit configuration, however, from the test pad, to which a signal for making the transition to the test mode is applied, an extra current other than the current to be measured in the evaluation flows to the test circuit in correspondence with the applied voltage.

That is, in a test circuit of FIG. 6, the voltage V16 applied to the test pad 16 for making the transition to the test mode is set to a voltage higher than an internal voltage VCP, whereby a signal CEH of an inverter 24 becomes an L level from an H level. The voltage V16 is applied to the inverter 24 from a connection point P0 through the P-channel MOS transistor 22 and the N-channel MOS transistor 23.

FIG. 7 is a waveform diagram describing the operation of a conventional test circuit. In the waveform A, the vertical axis indicates the voltage V16 applied to the test pad 16, and the horizontal axis indicates time. The waveform B illustrates a change in the signal CEH corresponding to a change in the voltage V16. The vertical axis indicates the voltage level of the signal CEH, and the horizontal axis indicates time. The waveform C illustrates a change in current I16 corresponding to the change in the voltage V16. The vertical axis indicates the current I16, and the horizontal axis indicates time.

In FIG. 7, the voltage V16 supplied to the test pad 16 increases, and the voltage of the connecting point P0 which is supplied to the inverter 24 exceeds the logical threshold voltage VthL of the inverter 24 at time t01. That is, at the time t01, the voltage V16 reaches a voltage at which the test circuit transitions to the test mode. Further, at a time t02, the voltage V16 lowers to a voltage at which the test circuit goes out from the test mode.

In the test mode, the current I16 flows from the test pad 16 to the ground by the voltage V16 through the current limiting circuit 25.

As described above, since the current I16 always flows via the current limiting circuit 25 in the test mode, it is not possible to share the test pad to which the signal is applied for transition of the test circuit to the test mode in which current is measured, and the test pad to which the voltage for current measurement is applied.

On the other hand, the manufacturing cost of the semiconductor integrated circuit increases as the area of a chip for formation of the circuit becomes larger. In order to reduce the manufacturing cost, more effort of reducing the area of the chip of the semiconductor integrated circuit by the reduction of design rules or the like has hence been carried out.

As already described, however, since the test pad cannot be shared between the input terminal for transition of the test circuit to the test mode and the measurement terminal for current measurement, and since the number of test pads increases, the area of the region for forming each test pad increases, and the area of the chip becomes large, thus leading to an increase in the manufacturing cost.

The present invention has been made to provide a test circuit and a semiconductor device capable of sharing a test pad as for an input terminal for transition of the test circuit to a test mode and a measurement terminal for current measurement, more reducing the number of test pads, and making a chip more compact, thereby reducing the manufacturing cost.

There is provided a test circuit according to an embodiment of the present invention having a test pad supplied with a test signal causing the test circuit to be transitioned to a test mode. The test circuit includes a first p channel MOS transistor having a source connected to the test pad, and a gate to which a prescribed reference voltage is applied, a first n channel MOS transistor having a drain connected to a drain of the first p channel MOS transistor, and a source grounded via a first current limiting element, and a control circuit configured to connect an input terminal thereof to the drain of the first n channel MOS transistor and connect an output terminal thereof to a gate of the first n channel MOS transistor and to control the first n channel MOS transistor from an on state to an off state when the test signal becomes a prescribed voltage or more.

By using the present invention, it is possible to provide a test circuit and a semiconductor device capable of sharing a test pad as for an input terminal for transition of the test circuit to a test mode and a measurement terminal for current measurement, more reducing the number of test pads, and making a chip more compact, thereby reducing a manufacturing cost.

DETAILED DESCRIPTION OF THE PREFERRED EMBODIMENTS

In the following description, a p-channel MOS transistor, an n-channel MOS transistor, and a p-channel depletion MOS transistor are respectively abbreviated as a p-transistor, an n-transistor, and a p-depletion transistor.

First Embodiment

Figure 1:
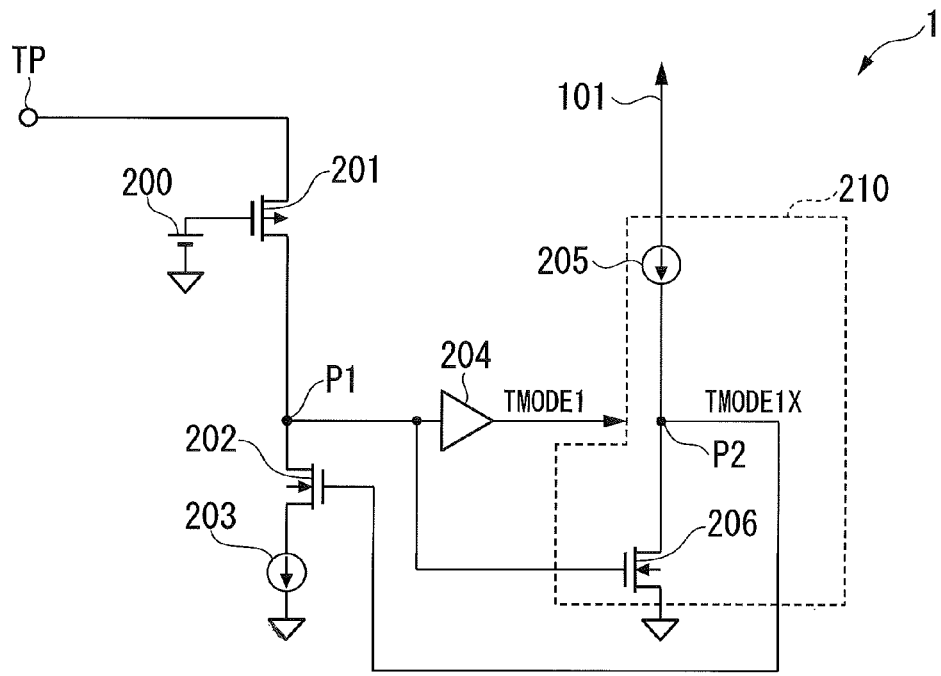
FIG. 1 is a circuit diagram illustrating an example of constructing a test circuit according to a first embodiment of the present invention.

A first embodiment of the present invention will hereinafter be described with reference to the accompanying drawings. FIG. 1 is a circuit diagram illustrating an example of constructing a test circuit according to the first embodiment of the present invention.

In the circuit diagram, the test circuit 1 includes a reference voltage source 200, a first p-transistor 201, a first n-transistor 202, a first current limiting element 203, a buffer 204, and a control circuit 210.

The reference voltage source 200 outputs a reference voltage VREF used in the test circuit 1.

The first p-transistor 201 has a source connected to a test pad TP, and a gate to which the reference voltage VREF is applied. The first p-transistor 201 is a p channel MOS transistor and is provided as a test mode detecting element. A test signal is applied to the test pad TP by a measuring device such as an external semiconductor tester or the like. A test signal of a voltage VTP is supplied as an arbitrary voltage from the measuring device.

The first n-transistor 202 has a drain connected to a drain of the first p-transistor 201, a gate supplied with a control signal TMODE1X supplied from the control circuit 210, and a source which is grounded via the first current limiting element 203. The first n-transistor 202 is an n channel MOS transistor. When the test circuit 1 is transitioned to a test mode, the first n-transistor 202 prevents a current flow for maintaining the test mode from the test pad (test terminal) TP via the first p-transistor 201.

The drain of the first p-transistor 201 and the drain of the first n-transistor 202 are connected at the connecting point P1. A voltage of the connecting point P1 is supplied via the buffer 204 from an output terminal of the test circuit 1 as a test mode detection signal TMODE1. In the present embodiment, an H level of the test mode detection signal TMODE indicates the transition of the test circuit 1 to the test mode and an L level of the test mode detection signal TMODE1 indicates no transition of the test circuit 1 thereto. Further, the voltage VP1 of the connecting point P1 is supplied to the control circuit 210.

The control circuit 210 includes a second current limiting element 205 and a second n-transistor 206.

The second n-transistor 206 is an n channel MOS transistor and has a drain connected to a power supply terminal 101 (power supply voltage VREG) through the second current limiting element 205, a gate connected to the connecting point P1, and a source which is grounded. A connecting point P2 indicates a connecting point of the second current limiting element 205 and the drain of the second n-transistor 206. The voltage of the connecting point P2 is supplied to the gate of the first n-transistor 202 as a control signal TMODE1X.

When the voltage VP1 supplied to the connecting point P1 is at an H level, the control circuit 210 sets the control signal TMODE1X to an L level. When the voltage VP1 supplied to the connecting point P1 is at an L level, the control circuit 210 sets the control signal TMODE1X to an H level. Thus, when the test circuit 1 transitions to the test mode, the control circuit 210 brings the first n-transistor 202 from an on state to an off state to shut off the current, which is a mode detection current, for detecting the test mode which flows from the test pad TP to the ground via the first n-transistor 202. As a result, while the test circuit 1 maintains the test mode after the transition to the test mode, the mode detection current which is an extra current other than the measurement current flowing in the evaluation object does not flow from the test pad TP.

As described above, after the transition of the test circuit to the test mode, the control signal TMODE1X becomes an L level, and hence the current for maintaining the test mode does not flow in the first n-transistor 202. Thus, it is possible to apply a prescribed voltage to the test pad TP and measure only the current flowing in the element connected to the connecting point P1. The test pad TP can be made shared for the detection of the transition to the test mode and the measurement of the current flowing in the element under evaluation.

Figure 2:
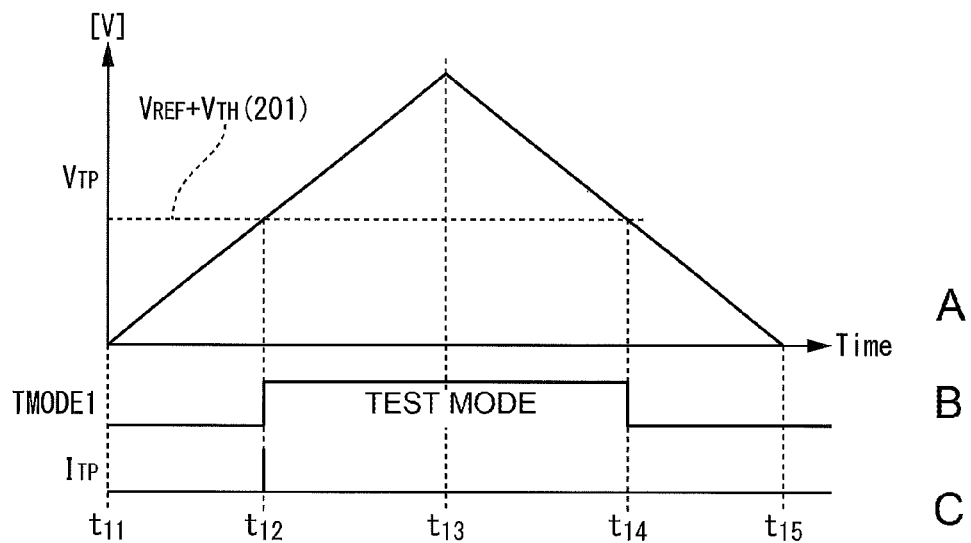
FIG. 2 is a waveform diagram describing the operation of the test circuit according to the first embodiment of the present invention.

FIG. 2 is a waveform diagram describing the operation of the test circuit according to the first embodiment. In FIG. 2, waveform A illustrates a change with time of the voltage VTP applied to the test pad TP. The vertical axis indicates voltage, and the horizontal axis indicates time.

Waveform B illustrates a change in the voltage level of the test mode detection signal TMODE1 corresponding to the voltage VTP in the waveform A.

Waveform C illustrates a change in the drain current ITP flowing in the first n-transistor, corresponding to the voltage VTP in the waveform A.

At time t11 the voltage VTP applied to the test pad TP is 0V. Subsequently, the voltage VTP gradually increases with the elapse of time.

At time t12 the voltage VTP gradually increases to exceed the sum of the reference voltage VREF and the threshold voltage VTH (201). Here, the threshold voltage VTH (201) is a threshold voltage of the first p-transistor 201. That is, when the voltage VTP exceeds a voltage obtained by adding the reference voltage VREF and the threshold voltage of the first p-transistor 201, the first p-transistor 201 enters an on state. Thus, the voltage VP1 of the connecting point P1, i.e., the test mode detection signal TMODE1 becomes an H level. In the second n-transistor 206, the voltage VP1 of an H level is applied to the gate.

Further, the second n-transistor 206 is brought into an on state, and hence the voltage of the connecting point P2, i.e., the control signal TMODE1X changes from an H level to an L level. Since the control signal TMODE1X applied to the gate of the first n-transistor 202 becomes an L level, the first n-transistor 202 is brought into an off state. At this time, the drain current ITP flows in the first n-transistor 202 during a period from the on state of the first p-transistor 201 begins until the off state of itself begins.

At time t13 the voltage VTP applied to the test pad becomes the highest to the maximum voltage and gradually lowers. The maximum voltage is appropriately selected corresponding to the element under evaluation.

At time t14 the voltage VTP becomes smaller than or equal to the sum of the reference voltage VREF and the threshold voltage VTH (201). That is, when the voltage VTP becomes smaller than or equal to a voltage obtained by adding the reference voltage VREF and the threshold voltage of the first p-transistor 201, the first p-transistor 201 is brought into an off state. Thus, the voltage of the connecting point P1, i.e., the test mode detection signal TMODE1 applied to the gate of the second n-transistor 206 becomes an L level.

Thus, the second n-transistor 206 becomes an off state, so that the voltage of the connecting point P2, i.e., the control signal TMODE1X changes from an L level to an H level. Since the control signal TMODE1X applied to the gate of the first n-transistor 202 becomes an H level, the first n-transistor 202 is brought into an on state.

At time t15 the voltage VTP applied to the test pad TP gradually lowers as the time elapses, so that the voltage VTP becomes 0V.

According to the present embodiment, since the current for maintaining the test mode does not flow after the transition to the test mode, the test pad TP can be used as a current measurement terminal for the object, which is a transistor, a resistor, or the like, under evaluation at the voltage exceeding the sum of the reference voltage VREF and the threshold voltage VTH (201).

Thus, according to the present embodiment, the test pad can be shared for the detection of the transition to the test mode and the measurement of the current flowing in the element under evaluation. By reducing the number of test pads, the area of a chip for forming a semiconductor circuit can be made small, and hence the manufacturing cost of the semiconductor circuit can be reduced.

Second Embodiment

Figure 3:
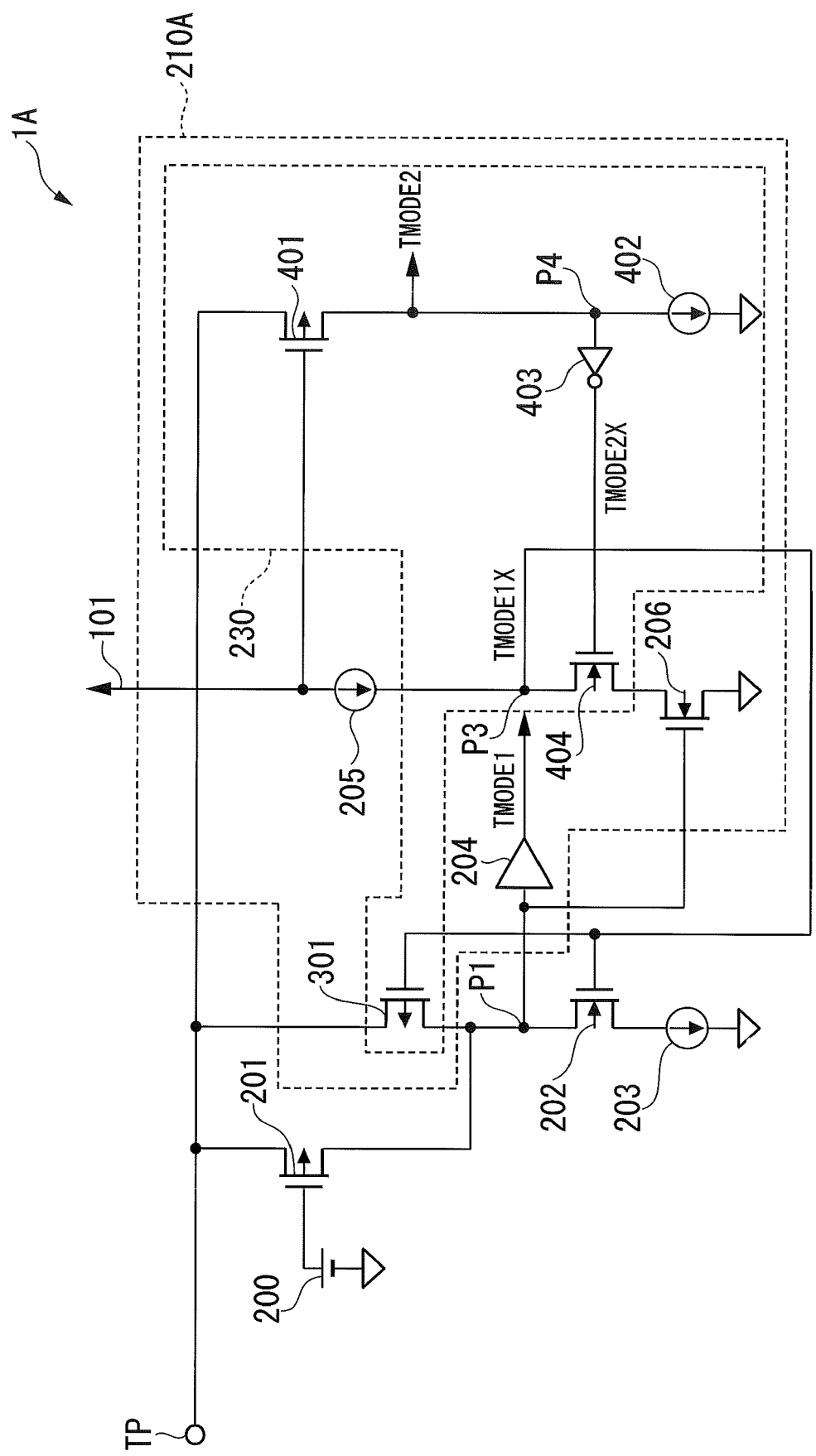
FIG. 3 is a circuit diagram illustrating an example of constructing a test circuit according to a second embodiment of the present invention.

The second embodiment of the present invention will hereinafter be described with reference to the accompanying drawings. FIG. 3 is a circuit diagram illustrating an example of constructing a test circuit according to the second embodiment of the present invention.

In the circuit diagram, the test circuit 1A includes a control circuit 210A in which a hysteresis circuit 230 is added to the configuration of the control circuit 210 in the test circuit 1 according to the first embodiment.

The hysteresis circuit 230 includes a third p-transistor 301, a second p-transistor 401, a third n-transistor 404, a third current limiting element 402, and an inverter 403. The hysteresis circuit 230 performs hysteresis control in which the value of the voltage VTP of the test signal at which the test circuit goes out from a test mode is lowered against the value of the voltage VTP at which the test circuit transitions to the test mode.

The third p-transistor 301 is a p channel MOS transistor and has a source connected to a test pad TP, a gate connected to a connecting point P3, and a drain connected to a connecting point P1.

The third n-transistor 404 is an n channel MOS transistor and has a drain connected to a power supply terminal 101, from which power supply voltage VREG is supplied, via a second current limiting element 205, a gate to which a control signal TMODE2X is applied, and a source connected to a drain of a second n-transistor 206.

Here, the connecting point P3 indicates a connecting point of the second current limiting element 205 and the drain of the third n-transistor 404. A voltage of the connecting point P3 is supplied to a gate of a first n-transistor 202 and a gate of a third p-transistor 301 as the control signal TMODE1X as in the first embodiment.

The second p-transistor 401 is a p channel MOS transistor and has a source connected to the test pad TP, a gate connected to the power supply terminal 101, and a drain which is grounded via the third current limiting element 402. A connecting point P4 indicates a connecting point of a drain of the second p-transistor 401 and the third current limiting element 402. A voltage of the connecting point P4 is applied to an input terminal of the inverter 403 as a control signal TMODE2.

The inverter 403 is a logic NOT gate element. The inverter 403 has the input terminal connected to the connecting point P4, and an output terminal connected to the gate of the third n-transistor 404. A control signal TMODE2X obtained by inverting the voltage level of the control signal TMODE2 is applied to the gate of the third n-transistor 404.

Figure 4:
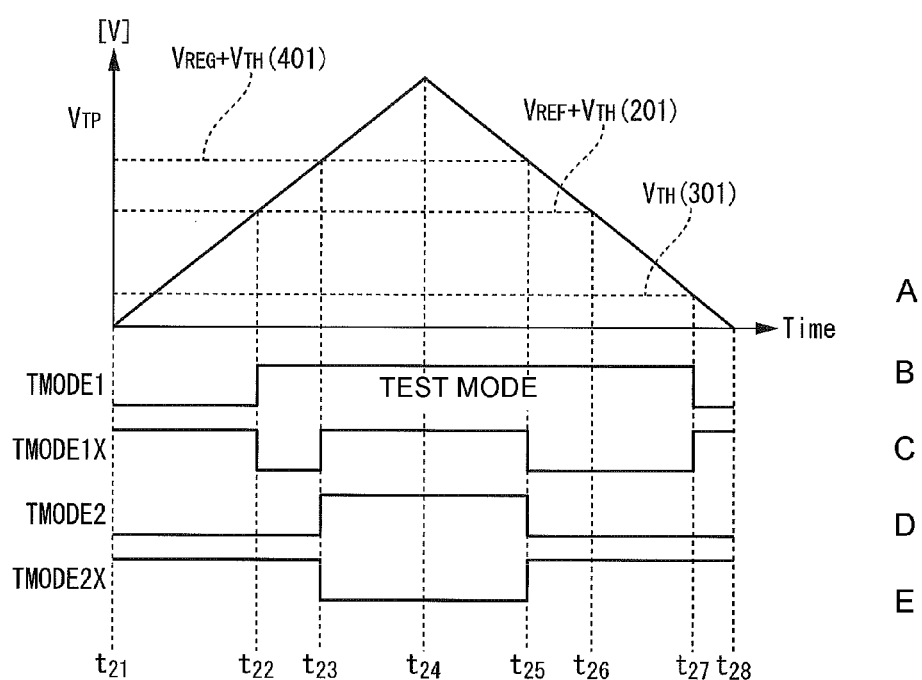
FIG. 4 is a waveform diagram describing the operation of the test circuit according to the second embodiment of the present invention.

FIG. 4 is a waveform diagram describing the operation of the test circuit according to the first embodiment. In FIG. 4, waveform A illustrates a change with time in the voltage VTP applied to the test pad TP. The vertical axis indicates voltage, and the horizontal axis indicates time.

Waveform B illustrates a change in the voltage level of a test mode detection signal TMODE1 corresponding to the voltage VTP in the waveform A.

Waveform C illustrates a change in the voltage level of the control signal TMODE1X corresponding to the voltage VTP in the waveform A.

Waveform D illustrates a change in the voltage level of the control signal TMODE2 corresponding to the voltage VTP in the waveform A.

Waveform E illustrates a change in the voltage level of the control signal TMODE2X corresponding to the voltage VTP in the waveform A.

At time t21 the voltage VTP applied to the test pad TP is 0V. Subsequently, the voltage VTP gradually increases with the elapse of time.

At a time t22 the voltage VTP gradually increases to exceed the sum of the reference voltage VREF and the VTH (201). That is, when the voltage VTP exceeds a voltage obtained by adding the reference voltage VREF and the threshold voltage VTH (201) of a first p-transistor 201, the first p-transistor 201 becomes an on state. Thus, a voltage VP1 applied to a gate of the second n-transistor 206 becomes an H level, so that the second n-transistor 206 is brought into an on state.

Further, the value of the voltage of the connecting point P3, i.e., the control signal TMODE1X changes from an H level to an L level. At this time, since the second p-transistor 401 is in an off state, the control signal TMODE2 is at an L level. The control signal TMODE2X supplied from the inverter 403 thereby goes to an H level, and the third n-transistor 404 is hence in an on state.

Further, since the control signal TMODE1X becomes the L level, and the voltage VTP exceeds a threshold voltage VTH (301) of the third p-transistor 301, the third p-transistor 301 is brought into an on state, and the first n-transistor 202 is brought into an off state. A current flowing from the test pad TP to the ground via the first n-transistor 202 is thus shut off.

At a time t23 the voltage VTP exceeds the sum of the power supply voltage VREG and the threshold voltage VTH (401). That is, when the voltage VTP exceeds a voltage obtained by adding the power supply voltage VREG and the threshold voltage VTH (401) of the second p-transistor 401, the second p-transistor 401 becomes an on state. Thus, the voltage level of the connecting point P4, i.e., the control signal TMODE2 changes from an L to H level, and hence the control signal TMODE2X supplied from the inverter 403 changes from an H to L level. Thus, the third n-transistor 404 is brought into an off state so that the control signal TMODE1X becomes an H level.

Further, since the control signal TMODE1X becomes an H level, the first n-transistor 202 is brought into an on state.

On the other hand, since the voltage VTP exceeds the voltage obtained by adding the power supply voltage VREG and VTH (401), the third p-transistor 301 maintains the on state. Further, the first p-transistor 201 also maintains the on state. Thus, the test mode detection signal TMODE1 maintains an H level.

At a time t24 the voltage VTP applied to the test pad becomes the highest to the maximum voltage and gradually lowers. The maximum voltage is appropriately selected corresponding to the element under evaluation.

At time t25 the voltage VTP becomes smaller than or equal to the sum of the power supply voltage VREG and threshold voltage VTH (401). Since the voltage VTP becomes smaller than or equal to a voltage obtained by adding the power supply voltage VREG and the threshold voltage VTH (401) of the second p-transistor 401, the second p-transistor 401 is brought into an off state. Thus, the control signal TMODE2 changes from an H to L level, and the control signal TMODE2X supplied from the inverter 403 changes from an L to H level. Consequently, the third n-transistor 404 becomes an on state, and hence the control signal TMODE1X becomes an L level.

Further, since the control signal TMODE1X becomes an L level, the first n-transistor 202 is brought into the off state.

On the other hand, since the voltage VTP exceeds the threshold voltage VTH (301), the third p-transistor 301 maintains the on state. Further, the first p-transistor 201 also maintains the on state. Thus, the test mode detection signal TMODE1 is maintained at the H level.

At this time, since both the first n-transistor 202 and the second p-transistor 401 become the off state, current which flows to maintain the test mode of the test circuit 1A is shut off and stopped.

At time t26 the voltage VTP gradually lowers to become smaller than or equal to the sum of the reference voltage VREF and the VTH (201). That is, when the voltage VTP becomes less than or equal to a voltage obtained by adding the reference voltage VREF and the threshold voltage VTH (201) of the first p-transistor 201, the first p-transistor 201 becomes an off state. On the other hand, since the voltage VTP exceeds the threshold voltage VTH (301), the third p-transistor 301 maintains the on state. Thus, the test mode detection signal TMODE1 applied to the gate of the second n-transistor 206 is maintained at an H level, and hence the second n-transistor 206 maintains the on state.

At time t27 the voltage VTP gradually lowers to become smaller than or equal to the threshold voltage VTH (301). Since the voltage VTP becomes less than or equal to the threshold voltage VTH (301) of the third p-transistor 301, the third p-transistor 301 is brought into an off state. Thus, the test mode detection signal TMODE1 becomes from an H to L level, so that the second n-transistor 206 is brought into an off state, and the control signal TMODE1X becomes from an L to H level. Thus, the first n-transistor 202 becomes the on state.

At time t28 the voltage VTP applied to the test pad TP gradually lowers as the time elapses to reach 0V.

In the present embodiment as described with FIG. 4, the voltage VTP increases, and the test circuit transitions to the test mode at the time t22 at which the voltage VTP exceeds the sum of the reference voltage VREF and the threshold voltage VTH (201). Thereafter, the voltage VTP is lowered when the time exceeds the time t24, and the current for maintaining the test mode is shut off during the period from the time t25 at which the voltage VTP becomes less than or equal to the sum of the power supply voltage VREG and the threshold voltage VTH (401), to the time at which the voltage VTP becomes the threshold voltage VTH (301) and the test circuit goes out from the test mode.

According to the present embodiment, a current measurement range can be obtained in which the current for maintaining the test mode is shut off as the voltage range between the threshold voltage VTH (301) and the sum of the power supply voltage VREG and the threshold voltage VTH (401) since the hysteresis circuit 230 permits the test circuit 1A to have hysteresis characteristics, against the voltage VTP supplied from the test pad TP, between the voltage at which the test circuit 1A transitions to the test mode and the voltage at which the test circuit 1A goes out from the test mode. It is thereby possible to measure the value of the current flowing through the element under evaluation at the voltage lower than the voltage in the first embodiment.

Also, in the present embodiment, a pull-down resistor is inserted between the test pad TP and the ground to fix the potential of the test pad TP to the ground voltage level so as to avoid a variation in the potential of the test pad TP in case of absence of connection. In this configuration, there is a need to correct the measurement current relative to the object under evaluation by measuring in advance only a current flowing through the pull-down resistor in the absence of the measurement current through the object under evaluation and eliminating the current flowing to the ground through the pull-down resistor from the measurement current relative to the object.

Further, in the present embodiment, it is possible to change the range of the voltage for the transition to the test mode and the voltage for the exit from the test mode, i.e., a hysteresis range against the voltage VTP, and adjust a voltage range in which measurement of the object under evaluation is carried out.

For example, setting the voltage VTP applied to the object under evaluation to a higher voltage can be realized by making the threshold voltage VTH (401) of the second p-transistor 401 higher as understood by viewing the FIG. 4.

Also, setting the voltage VTP applied to the object under evaluation to a lower voltage can be realized by making the threshold voltage VTH (301) of the third p-transistor 301 lower.

Figure 5:
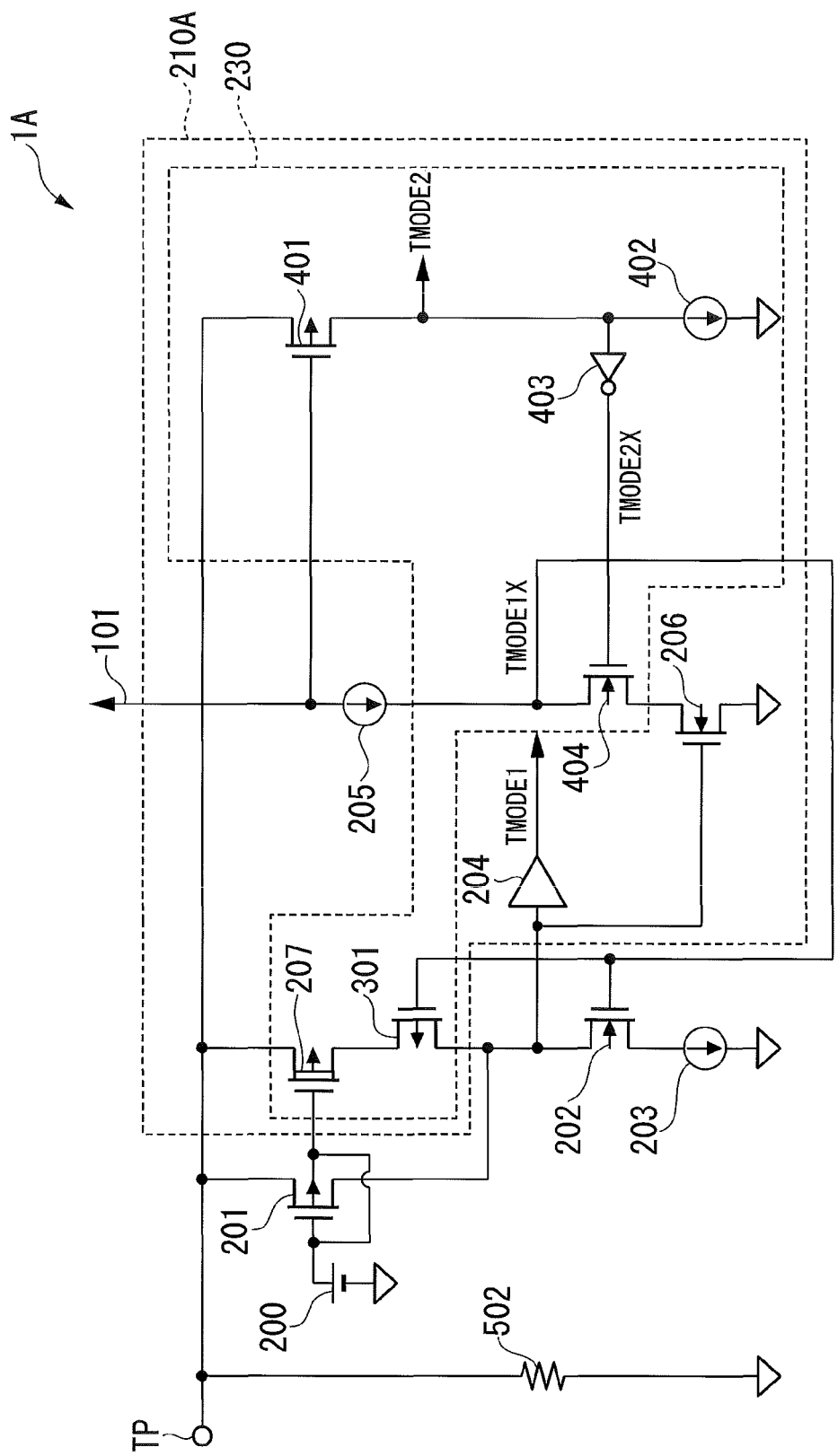
FIG. 5 is a circuit diagram illustrating another example of constructing the test circuit according to the second embodiment of the present invention.
Figure 6:
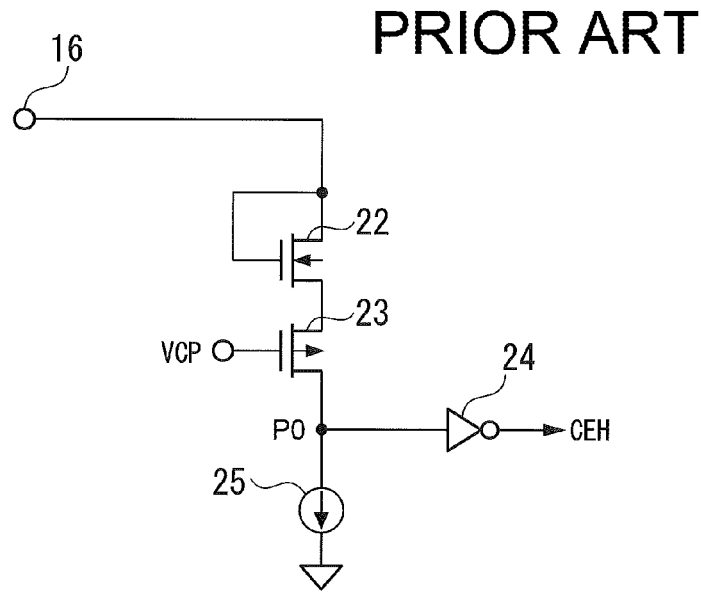
FIG. 6 is a circuit diagram illustrating an example of constructing a conventional test circuit.
Figure 7:
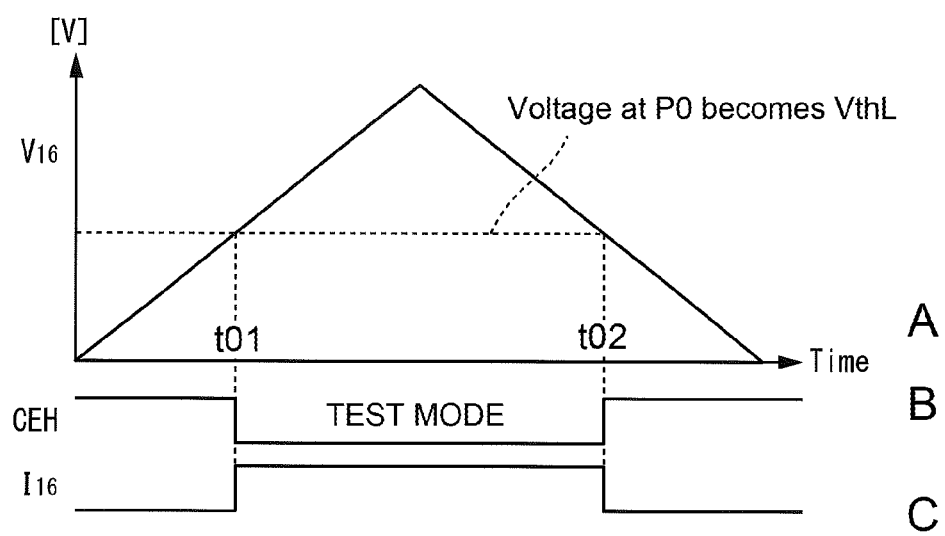
FIG. 7 is a waveform diagram describing the operation of the conventional test circuit.

In this case, since the change of the threshold voltage of the transistor needs complicated control for of the manufacturing process, the same effect can be ostensibly obtained by inserting a depletion transistor as illustrated in FIG. 5. FIG. 5 is a circuit diagram illustrating another example of constructing a test circuit according to the second embodiment of the present invention.

Difference from the already-described test circuit 1A in FIG. 3 resides in that the present test circuit has a p-depletion transistor 207 being a p channel depletion MOS transistor. The p-depletion transistor 207 is inserted between a test pad TP and a source of a third p-transistor 301. That is, the p-depletion transistor 207 has a source connected to the test pad TP, a gate to which a reference voltage VREF is applied, and a drain connected to the source of the third p-transistor 301.

As described above, by inserting the p-depletion transistor 207 between the test pad TP and the source of the third p-transistor 301, the test circuit 1A goes out from a test mode by a voltage VTP higher than a threshold voltage VTH (301) of the third p-transistor 301 without changing the threshold voltage VTH (301) of the third p-transistor 301. That is, the insertion of the p-depletion transistor 207 between the test pad TP and the source of the third p-transistor 301 enables ostensible rise of the threshold voltage VTH (301).

Further, a threshold voltage VTH (401) of a second p-transistor 401 can be raised ostensibly by inserting a p-depletion transistor between the test pad TP and a source of the second p-transistor 401. Thus, it is possible to carry out current measurement for an object under evaluation by a voltage VTP higher than the voltage in the test circuit 1A illustrated in FIG. 3 without controlling the threshold voltage VTH by the manufacturing process.

Although the embodiments of the present invention have been described above in detail with reference to the accompanying drawings, specific configurations are not limited to those in the embodiments and also include design or the like in the scope not departing from the spirit of the present invention.

What is claimed is:

1. A test circuit having a test pad supplied with a test signal for transition to a test mode, comprising:
    a first p channel MOS transistor having a source connected to the test pad, and a gate to which a prescribed reference voltage is applied;
    a first n channel MOS transistor having a drain connected to a drain of the first p channel MOS transistor, and a source connected to a ground through a first current limiting element; and
    a control circuit having an input terminal connected to the drain of the first n channel MOS transistor and an output terminal connected to a gate of the first n channel MOS transistor, and configured to control the first n channel MOS transistor from an on state to an off state by the test signal having a prescribed voltage or more.

2. The test circuit according to claim 1, wherein the control circuit comprises a second n channel MOS transistor having a drain connected to the gate of the first n channel MOS transistor and to a power supply terminal through a second current limiting element, a gate connected to the drain of the first n channel MOS transistor, and a source connected to the ground.

3. The test circuit according to claim 1, further comprising a hysteresis circuit configured to perform hysteresis control in which a voltage of the test signal at which the test circuit goes out from the test mode is lowered against a voltage of the test signal at which the test circuit transitions to the test mode.

4. The test circuit according to claim 3, wherein the hysteresis circuit comprises:
    a second p channel MOS transistor having a source connected to the test pad, a gate connected to the power supply terminal, and a drain connected to the ground through a third current limiting element,
    a third p channel MOS transistor having a source connected to the test pad, a gate connected to the gate of the first n channel MOS transistor, and a drain connected to the drain of the first n channel MOS transistor,
    a third n channel MOS transistor having a drain connected to the second current limiting element, and a source connected to the drain of the second n channel MOS transistor, and
    an inverter circuit having an input terminal connected to the drain of the second p channel MOS transistor, and an output terminal connected to a gate of the third n channel MOS transistor.

5. The test circuit according to claim 4, wherein the hysteresis circuit further comprises a p channel depletion MOS transistor inserted between the test pad and the third p channel MOS transistor or between the test pad and the second p channel MOS transistor.

6. The test circuit according to claim 2, further comprising a hysteresis circuit configured to perform hysteresis control in which a voltage of the test signal at which the test circuit goes out from the test mode is lowered against a voltage of the test signal at which the test circuit transitions to the test mode.

7. The test circuit according to claim 6, wherein the hysteresis circuit comprises:
    a second p channel MOS transistor having a source connected to the test pad, a gate connected to the power supply terminal, and a drain connected to the ground through a third current limiting element,
    a third p channel MOS transistor having a source connected to the test pad, a gate connected to the gate of the first n channel MOS transistor, and a drain connected to the drain of the first n channel MOS transistor,
    a third n channel MOS transistor having a drain connected to the second current limiting element, and a source connected to the drain of the second n channel MOS transistor, and
    an inverter circuit having an input terminal connected to the drain of the second p channel MOS transistor, and an output terminal connected to a gate of the third n channel MOS transistor.

8. The test circuit according to claim 7, wherein the hysteresis circuit further comprises a p channel depletion MOS transistor inserted between the test pad and the third p channel MOS transistor or between the test pad and the second p channel MOS transistor.

9. A semiconductor device comprising the test circuit according to claim 1.

10. A semiconductor device comprising the test circuit according to claim 2.

11. A semiconductor device comprising the test circuit according to claim 3.

* * * * *